US008580696B2

(12) United States Patent
Mori et al.

(10) Patent No.: US 8,580,696 B2

(45) Date of Patent: Nov. 12, 2013

(54) SYSTEMS AND METHODS FOR DETECTING WATERMARK FORMATIONS ON SEMICONDUCTOR WAFERS

(75) Inventors: Kiyoshi Mori, San Antonio, TX (US); Shu Ikeda, Austin, TX (US); Gabriel Gebara, Austin, TX (US)

(73) Assignee: Abound Limited, Menlo Park, CA (US)

( * ) Notice: Subject to any disclaimer, the term of this patent is extended or adjusted under 35 U.S.C. 154(b) by 1442 days.

(21) Appl. No.: 11/829,581

(22) Filed: Jul. 27, 2007

(65) Prior Publication Data

US 2009/0028422 A1 Jan. 29, 2009

(51) Int. Cl.
*H01L 21/302* (2006.01)

(52) U.S. Cl.
USPC .............. 438/753; 438/745; 438/766; 216/99

(58) Field of Classification Search
USPC ........... 438/754, 12, 368, 369, 745, 753, 763, 438/766; 216/41, 67, 87, 99; 134/1.2, 19
See application file for complete search history.

(56) References Cited

U.S. PATENT DOCUMENTS 5,932,493 A 8/1999 Akatsu et al. ................. 438/745
6,818,506 B2 * 11/2004 Joo et al. ....................... 438/257
7,662,543 B2 * 2/2010 Kawamura et al. ........... 430/311
2006/0128084 A1 * 6/2006 Jang et al. ..................... 438/197
2006/0196527 A1 * 9/2006 Nishimura et al. ............... 134/2

OTHER PUBLICATIONS

Ahn et al., "Identification and removal of defects on silicon wafer processed with a rinse with/without megasonics in DI water," VLSI and CAD, 6th International Conference, 459-642, 1999.

* cited by examiner

*Primary Examiner* — Lan Vinh

(74) *Attorney, Agent, or Firm* — Fulbright & Jaworski, LLP

(57) ABSTRACT

Systems and methods for detecting watermark formations on semiconductor wafers are described. In one embodiment, a method comprises providing a semiconductor wafer having at least one watermark sensitive region fabricated thereon, subjecting the wafer to a wet processing step, enhancing a susceptibility to detection of at least one watermark formation created on the at least one watermark sensitive region, and detecting the at least one watermark formation. In another embodiment, a method comprises growing a first oxide layer on a surface of a semiconductor wafer, patterning a watermark sensitive structure on the first oxide layer, depositing a silicon layer over the first oxide layer, doping a region of the silicon layer over the watermark sensitive structure with an impurity to create a watermark sensitive region that is prone to retaining watermark formations as result of a wet processing step, and growing a second oxide layer over the silicon layer.

3 Claims, 5 Drawing Sheets

502

503

501

SYSTEMS AND METHODS FOR DETECTING WATERMARK FORMATIONS ON SEMICONDUCTOR WAFERS

BACKGROUND OF THE INVENTION

1. Field of the Invention

The present invention relates generally to semiconductor fabrication and, more particularly, to systems and methods for detecting watermark formations on semiconductor wafers.

2. Description of Related Art

Semiconductor fabrication involves various “wet” and “dry” processing steps. Examples of wet processes include: patterning via wet etching or chemical-mechanical polishing, contamination removal, liquid-emersion inspection, and the like. Meanwhile, examples of dry processes include: dry etching, removal of liquids from the surface of the wafer, and the like. Insufficient drying of the wafer, especially after a wet process, generally leads to the formation of watermarks on the wafer’s surface.

One process that leads to the formation of watermarks may be generally described as follows. First, a semiconductor wafer undergoes a wet processing step and water droplets are formed on its surface. Then, oxygen from the air dissolves into the water droplet. The oxygen dissolved in the droplet reacts with silicon from the wafer to form $SiO_2$. The silicon oxide interacts with hydrogen within the water droplet and produces $H_2SiO_3$. When the water droplet evaporates, $H_2SiO_3$ residues remain on the wafer surface.

Depending upon the size of the watermark formations in relation to the size of device features fabricated on the wafer, the watermarks may result in manufacturing defects. And, with the increasingly reduced size of device features currently being fabricated, the presence of watermarks, however diminutive, presents a serious concern. U.S. Pat. No. 5,932,493 (the ’493 patent) discusses a method for minimizing watermarks on silicon substrates. In essence, the ’493 proposes preventing the formation of watermarks by rinsing silicon wafers in an organic solvent prior to drying.

BRIEF SUMMARY OF THE INVENTION

The present invention provides systems and methods for detecting watermark formations on semiconductor wafers. In one illustrative embodiment, a method comprises providing a semiconductor wafer having at least one watermark sensitive region fabricated thereon, subjecting the semiconductor wafer to a wet processing step, enhancing a susceptibility to detection of at least one watermark formation created on the at least one watermark sensitive region, and detecting the at least one watermark formation. The method may further comprise, for example, adjusting at least one processing parameter to control the formation of watermarks on the semiconductor wafer based upon the detection of the at least one watermark formation.

In another illustrative embodiment, a method comprises growing a first oxide layer on a surface of a semiconductor wafer, patterning a first watermark sensitive structure on the first oxide layer, depositing a silicon layer over the first oxide layer, doping a first region of the silicon layer over the first watermark sensitive structure with an impurity under a first condition to create a first watermark sensitive region that is prone, to a first degree, to retaining watermark formations as result of a wet processing step. The method may further comprise, for example, patterning a second watermark sensitive structure on the first oxide layer and doping a second region of the silicon layer over the second watermark sensitive structure with an impurity under a second condition to create a second watermark sensitive region that is prone, to a second degree, to retaining watermark formations as result of the wet processing step.

In yet another illustrative embodiment, a semiconductor wafer comprises a first watermark sensitive region having a first patterned area with a plurality of structures formed thereon, at least two of the plurality of structures positioned at approximately 90° angles from each other for retaining watermark formations during a wet processing step, where the first watermark sensitive region is doped with a first impurity under a first condition to make it prone, to a first degree, to retaining watermark formations as result of a wet processing step. The semiconductor wafer may further comprise, for example, a second watermark sensitive region having a second patterned area with a second plurality of structures formed thereon, at least two of the second plurality of structures positioned at approximately 90° angles from each other for retaining watermark formations during the wet processing step, where the second watermark sensitive region is doped with a second impurity under a second condition to make it prone, to a second degree, to retaining watermark formations as result of the wet processing step.

The term “coupled” is defined as connected, although not necessarily directly, and not necessarily mechanically. The terms “a” and “an” are defined as one or more unless this disclosure explicitly requires otherwise. The terms “substantially,” “approximately,” “about,” and variations thereof are defined as being largely but not necessarily wholly what is specified, as understood by a person of ordinary skill in the art. In one non-limiting embodiment, the term substantially refers to ranges within 10%, preferably within 5%, more preferably within 1%, and most preferably within 0.5% of what is specified.

The terms “comprise” (and any form of comprise, such as “comprises” and “comprising”), “have” (and any form of have, such as “has” and “having”), “include” (and any form of include, such as “includes” and “including”) and “contain” (and any form of contain, such as “contains” and “containing”) are open-ended linking verbs. As a result, a method or device that “comprises,” “has,” “includes” or “contains” one or more steps or elements possesses those one or more steps or elements, but is not limited to possessing only those one or more elements. Likewise, a step of a method or an element of a device that “comprises,” “has,” “includes” or “contains” one or more features possesses those one or more features, but is not limited to possessing only those one or more features. Furthermore, a device or structure that is configured in a certain way is configured in at least that way, but it may also be configured in ways other than those specifically described herein.

BRIEF DESCRIPTION OF THE SEVERAL VIEWS OF THE DRAWINGS

For a more complete understanding of the present invention, reference is now made to the following drawings, in which.

DETAILED DESCRIPTION OF THE INVENTION

In the following detailed description, reference is made to the accompanying drawings that illustrate embodiments of the present invention. These embodiments are described in sufficient detail to enable a person of ordinary skill in the art to practice the invention without undue experimentation. It should be understood, however, that the embodiments and examples described herein are given by way of illustration only, and not by way of limitation. Various substitutions, modifications, additions, and rearrangements may be made without departing from the spirit of the present invention. Therefore, the description that follows is not to be taken in a limited sense, and the scope of the present invention is defined only by the appended claims.

Figure 1:
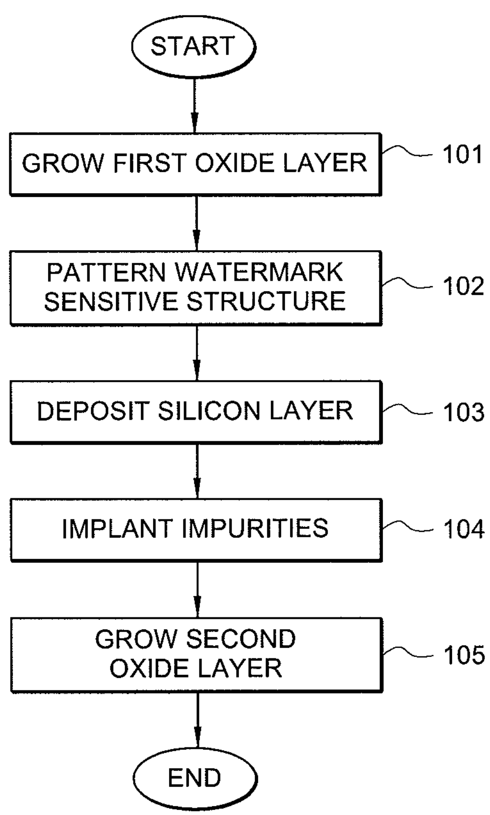
FIG. 1 is a flowchart of a method for fabricating a watermark sensitive region on a semiconductor wafer, according to one embodiment of the present invention.

The present invention provides systems and methods for detecting watermark formations on semiconductor wafers. Turning to FIG. 1, a flowchart of a method for fabricating a watermark sensitive region of a semiconductor wafer is depicted according to one embodiment of the present invention. In step 101, a first oxide layer may be grown on a substrate. Step 102 comprises patterning a watermark sensitive structure on the first oxide layer using a lithography process. Patterning step 102 may result in a plurality of structures formed on the wafer. Some of these structures may be, for example, positioned at approximately 90° angles from each other so that they may retain watermark formations resulting from a wet processing step. A silicon layer may be deposited over the first oxide layer in step 103. Step 104 comprises doping a region of the deposited silicon layer over the watermark sensitive structure with one or more impurities. Doping step 104 may enhance a hydrophobic aspect of the wafer. In step 105, a second oxide layer is grown over the doped region. In one embodiment, the second oxide layer may be thinner than the first oxide layer.

The watermark sensitive region created on the semiconductor wafer may therefore have a watermark sensitive structure patterned thereon and/or it may be doped with impurities. Each of these two distinct features may be designed to control a degree to which the watermark sensitive region is susceptible to watermark formations. In a preferred embodiment, the watermark semiconductor region has both features, although other embodiments may have only one of the two features.

In certain embodiments, more than one watermark sensitive region may be created on the same semiconductor wafer. In some cases, these watermark sensitive regions may have different watermark sensitive structures and/or different dopings. For example, when the watermark sensitive wafer at issue is a dedicated test wafer—i.e., a test wafer that is run through a wet process for the purpose of testing the process for defects—different watermark sensitive regions may be designed to resemble or simulate different types (or areas) of production wafers. When the watermark sensitive wafer at issue is a production wafer—i.e., a wafer with production devices or die fabricated thereon—watermark sensitive regions may be placed among production areas of the wafer.

Figure 2C:
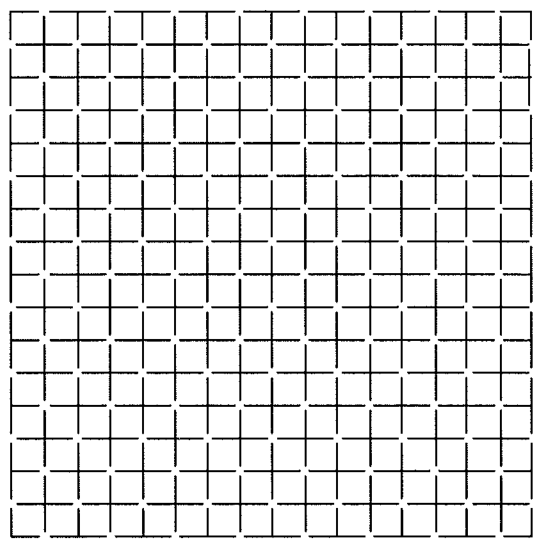
FIGS. 2A-C show different patterned areas formed on a watermark sensitive wafer, according to various embodiments of the present invention.
Figure 2B:
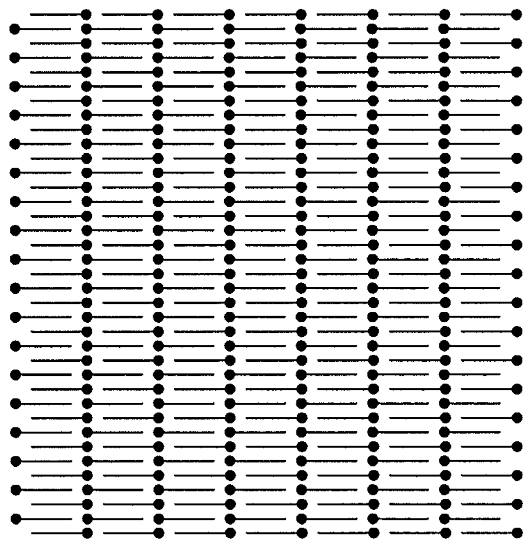
Figure 2A:
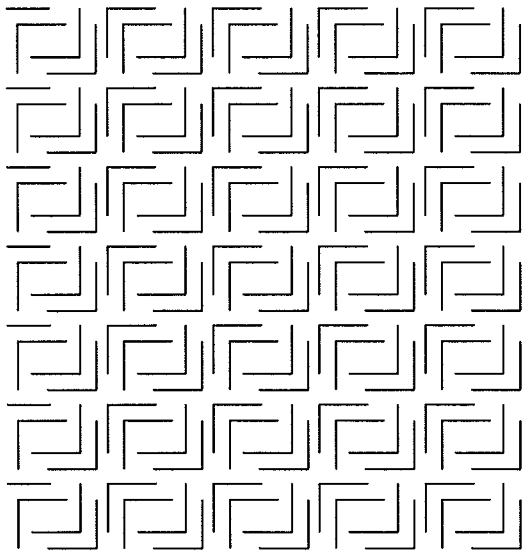

FIGS. 2A-C show different patterns formed on a watermark sensitive wafer, according to various embodiments of the present invention. FIGS. 2A and 2C show patterned areas with a plurality of structures formed thereon. In each case, at least two of the plurality of structures is positioned at approximately 90° angles from each other for retaining watermark formations during a wet processing step. These structures may have dimensions ranging from approximately 1 to approximately 100 nanometers. As a person of ordinary skill in the art will immediately recognize in light of the present disclosure, however, other watermark sensitive structures may also be fabricated within the scope of this invention. For example, FIG. 2B shows alternative watermark sensitive structures that are also designed to retain watermark formations.

Figure 3:
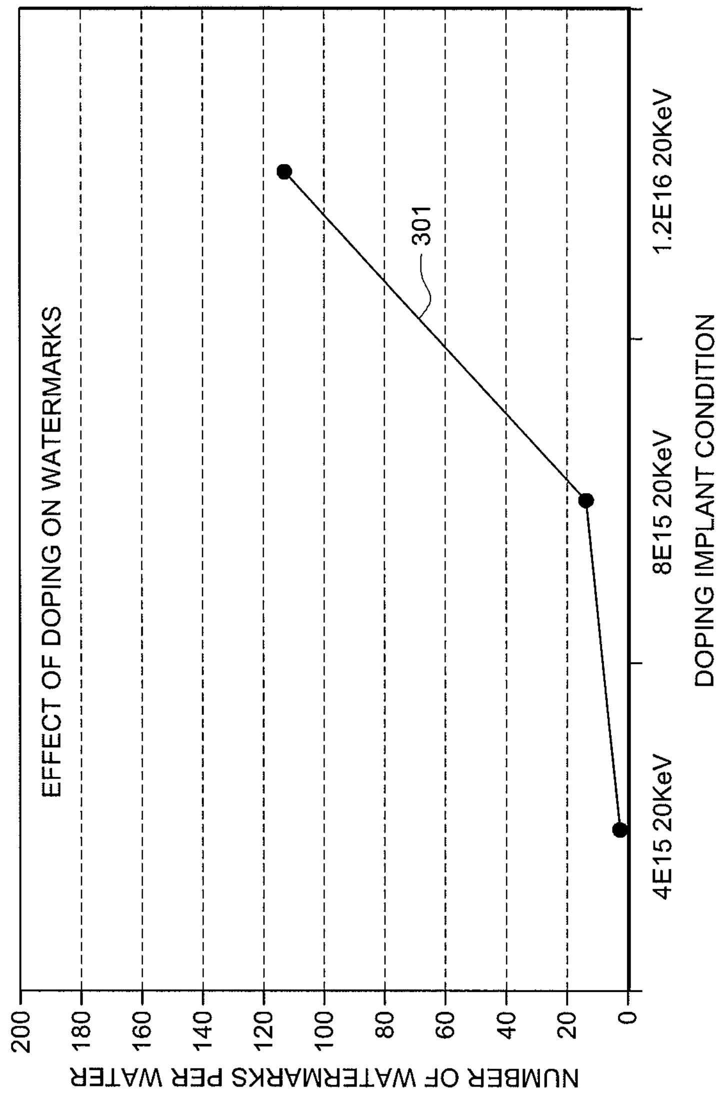
FIG. 3 is a graph showing a relationship between the number of watermark formations detected on various watermark sensitive regions of a wafer having different doping conditions, according to one embodiment of the present invention.

The graph of FIG. 3 illustrates a relationship between the number of watermark formations detected on various watermark sensitive regions having different doping conditions, according to one embodiment of the present invention. To reach these results, a wafer having three types of watermark sensitive regions that were substantially identical in all respects other than their doping implant conditions was submitted to a wet process. Curve 301 shows that the number of watermark formations resulting from the wet process is proportional to the impurity dose used during implantation. Hence, the number of watermark formations may be controlled, for example, by changing doping implant conditions of watermark sensitive regions.

Figure 4:
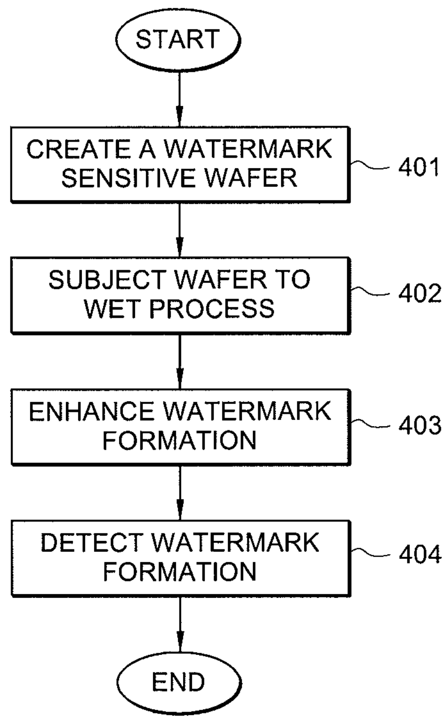
FIG. 4 is a flowchart of a method for detecting watermark formations, according to one embodiment of the present invention.

Turning now to FIG. 4, a flowchart of a method for detecting watermark formations is depicted according to one embodiment of the present invention. In step 401, a watermark sensitive wafer is created, for example, as shown above with respect to FIG. 1. Then, in step 402, the watermark sensitive wafer is subject to a wet process (or any other process) that may result in watermark formations thereon. Step 403 comprises enhancing a susceptibility to detection of watermark formations created on the watermark sensitive regions. In step 404, the resulting watermark formations my be detected using systems and methods known to those of ordinary skill in the art.

Upon detection in step 403, the number of watermark formations present on the watermark sensitive regions of the semiconductor wafer may be quantified, for example, per unit area. As such, the total number of watermarks present in the entire wafer may be accurately estimated by examination of a relatively small portion thereof—e.g., one or more watermark sensitive region. Further, the size of each watermark formation may also be determined. These and other variables may be then correlated with the types of structures and/or dopings used. Also, similar wafers having similar watermark sensitive regions may be subject to different processing steps so that their effects with respect to watermark formations may be analyzed. Some or all of the foregoing steps may be repeated to allow an operator to adjust one or more parameters in the wet process to control the formation of watermarks on subsequent wafers.

Step 403 of enhancing the susceptibility to detection of the watermark formations may be achieved, for example, by conducting an etch process. The etch process may selectively remove silicon portions of the watermark sensitive region while maintaining watermark formations (e.g., thin residual oxides) substantially intact. In one embodiment, the etch process may be a plasma etch using a $Cl_2$ and HBr gas mixture. The power level of the plasma etch may be low enough to preserve the watermark formation while being sufficiently high to reactively etch the silicon portions of in region. In one illustrative etch process, the pressure is approximately 10 mTorr, the power is approximately 100 W, the gas mixture of $Cl_2$/HBr is about 60/100 sccm, and the cathode temperature is at about 20° C.

Figure 5A:
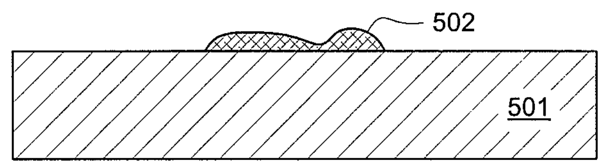
FIGS. 5A and B are cross-section views of a wafer undergoing a watermark enhancement process, according to one embodiment of the present invention.
Figure 5B:
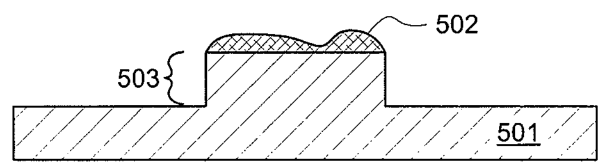

FIGS. 5A and 5B are cross-section views of a wafer undergoing a watermark enhancement process according to one exemplary embodiment of the invention. FIG. 5A shows watermark formation 502 on the surface of wafer 501. After an etch process such as, for example, the one described above with respect to step 403 of FIG. 4, a silicon portion surrounding watermark formation 502 is removed, and remaining silicon portion 503 enhances the visibility of watermark formation 502. Other types of defects (not shown) that may be present on wafer 501 but which are not attributable to watermark formations may also be removed along with the etching of the silicon surrounding formation 502. Thus, the resulting structure is more suitable for detection using defect detectors generally available in the field, and more accurately represents the number of watermark defects as distinguished from other types of defects.

Figure 6:
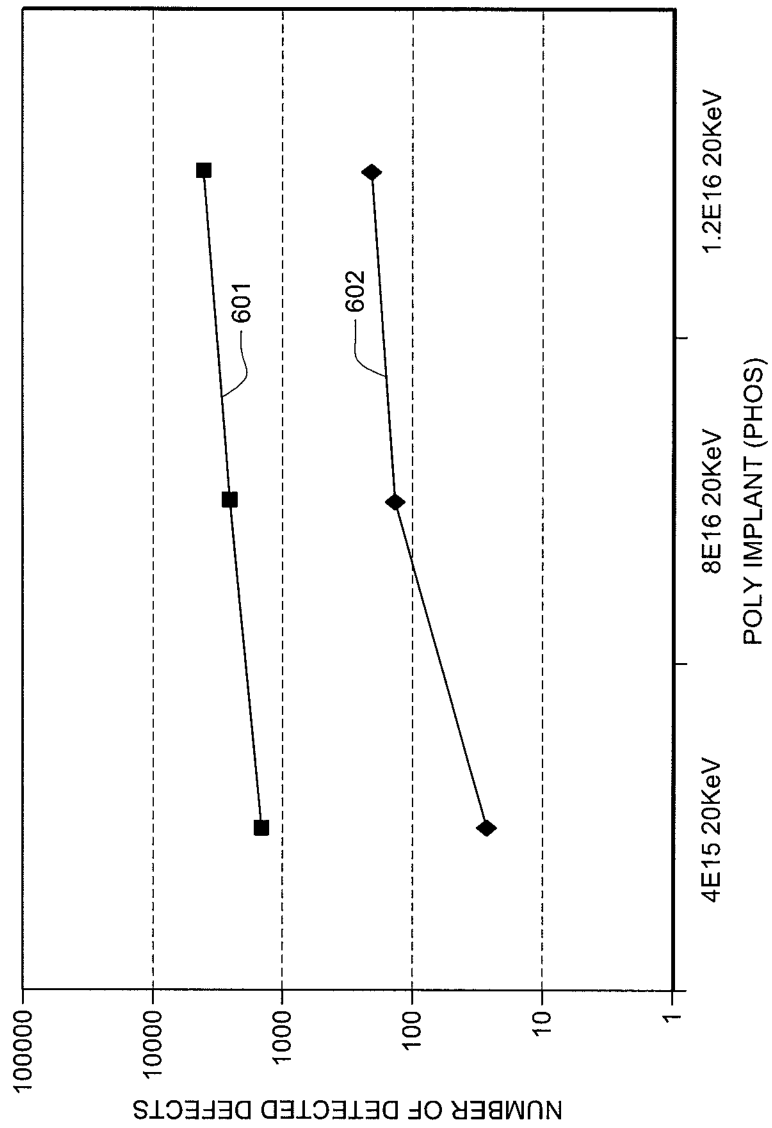
FIG. 6 is a graph showing the number of watermark formations detected for different wafer processing technologies, according to one embodiment of the present invention.

Referring to FIG. 6, a graph showing a number of watermark formations detected for different wafer processing technologies is depicted, according to one embodiment of the present invention. Curve 601 shows the number of watermarks for a wet spin process, whereas curve 602 shows the number of watermarks for a wet sink process. It may be noted that the wet spin process results in more defects than the wet sink process. It may also be noted that the number of watermark formations resulting from the wet sink process is more sensitive to doping conditions than its wet spin counterpart.

In light of the foregoing, it will be immediately apparent to a person of ordinary skill in the art that the present invention provide numerous advantages. Although watermark formations are typically very thin, they are now responsible for most defects caused in sub-micron semiconductor manufacturing facilities. In order to reduce or eliminate these problems, it is necessary to accurately detect and study watermark formations, and particularly how these formations are created in different environments. The present invention provides systems and methods for accurately detecting watermark formations created in a controlled manner. This is contrast with prior art methods, which generally cannot distinguish defects caused by watermarks from other types of defects. In possession of this disclosure, a person of ordinary skill in the art will be able to adjust both the design and production of semiconductors so as to minimize existing or potential problems caused by watermark formations, thus resulting in significant increase in yield and associated cost savings.

Although certain embodiments of the present invention and their advantages have been described herein in detail, it should be understood that various changes, substitutions and alterations can be made without departing from the spirit and scope of the invention as defined by the appended claims. Moreover, the scope of the present invention is not intended to be limited to the particular embodiments of the processes, machines, manufactures, means, methods, and steps described herein. As a person of ordinary skill in the art will readily appreciate from this disclosure, other processes, machines, manufactures, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufactures, means, methods, or steps.

The invention claimed is:

1. A method comprising:

growing a first oxide layer on a surface of a semiconductor wafer;

patterning a first watermark sensitive structure on the first oxide layer;

depositing a silicon layer over the first oxide layer;

doping a first region of the silicon layer over the first watermark sensitive structure with an impurity under a first condition to create a first watermark sensitive region that is prone, to a first degree, to retaining watermark formations as result of a wet processing step; and growing a second oxide layer over the silicon layer.

2. The method of claim 1, further comprising:

patterning a second watermark sensitive structure on the first oxide layer; and doping a second region of the silicon layer over the second watermark sensitive structure with an impurity under a second condition to create a second watermark sensitive region that is prone, to a second degree, to retaining watermark formations as result of the wet processing step.

3. The method of claim 1, further comprising:

subjecting the semiconductor wafer to the wet processing step;

enhancing a susceptibility to detection of at least one watermark formation created on at least one of the first and second watermark sensitive regions; and detecting the at least one watermark formation.

* * * * *